(12) United States Patent
Abbadie

(10) Patent No.: US 7,635,670 B2
(45) Date of Patent: *Dec. 22, 2009

(54) CHROMIUM-FREE ETCHING SOLUTION FOR SI-SUBSTRATES AND USES THEREFOR

(75) Inventor: Alexandra Abbadie, Le Versoud (FR)

(73) Assignee: S.O.I.Tec Silicon on Insulator Technologies, Bernin (FR)

(*) Notice: Subject to any disclaimer, the term of this patent is extended or adjusted under 35 U.S.C. 154(b) by 169 days.

This patent is subject to a terminal disclaimer.

(21) Appl. No.: 11/673,825

(22) Filed: Feb. 12, 2007

(65) Prior Publication Data

US 2008/0124938 A1     May 29, 2008

(30) Foreign Application Priority Data

Nov. 23, 2006    (EP)   .................................. 06291823

(51) Int. Cl.
    *C11D 7/26*      (2006.01)
    *C11D 7/08*      (2006.01)
    *H01L 21/00*     (2006.01)

(52) U.S. Cl. .......................... 510/175; 510/176; 438/8; 438/494; 438/745; 438/752; 438/753; 438/689; 134/1.3; 134/41; 134/42

(58) Field of Classification Search ................. 510/175, 510/176; 438/8, 494, 745, 752, 753, 689; 134/1.3, 41, 42

See application file for complete search history.

(56) References Cited

U.S. PATENT DOCUMENTS

| | | | | |
|---|---|---|---|---|
| 2,619,414 A | | 11/1952 | Heidenreich | ................ 438/691 |
| 3,923,567 A | | 12/1975 | Lawrence | ...................... 156/7 |
| 3,966,517 A | * | 6/1976 | Claes et al. | ................. 438/752 |
| 4,554,046 A | * | 11/1985 | Taguchi et al. | .............. 438/746 |
| 5,843,322 A | | 12/1998 | Chandler, Jr. | ................ 216/85 |
| 5,961,877 A | * | 10/1999 | Robinson et al. | ........... 252/79.2 |
| 6,410,436 B2 | * | 6/2002 | Yamagata et al. | ........... 438/689 |
| 7,507,670 B2 | * | 3/2009 | Shih et al. | ................... 438/704 |
| 2003/0013317 A1 | * | 1/2003 | Martin | ....................... 438/745 |
| 2004/0242015 A1 | * | 12/2004 | Kim et al. | .................... 438/753 |
| 2006/0141802 A1 | * | 6/2006 | Shih et al. | ................... 438/753 |
| 2008/0099718 A1 | * | 5/2008 | Abbadie et al. | ............ 252/79.3 |

FOREIGN PATENT DOCUMENTS

| | | |
|---|---|---|
| EP | 0553 855 | 11/1993 |
| GB | 1 314 648 | 4/1973 |
| JP | 59094828 | 5/1984 |
| JP | 2004349420 | 12/2004 |
| WO | WO 2006/027332 A1 | 3/2006 |

OTHER PUBLICATIONS

Dash, "Copper Precipitation on Dislocations in Silicon," Journal of Applied Physics, 27(10): 1193-1195 (1956).
F. Secco d' Aragona, "Dislocation Etch for (100) Planes in Silicon," Journal of Electrochemical Society, 119(7): 948-951 (1972).
K.R. Williams, "16.3 Silicon Preferential (defeat delineation) etch rates", pp. 822 & 824 (1998).
D.G. Schimmel, "Defect Etch for <100> Silicon Evaluation", J. Electrochem,. Soc.: Solid-State Science and Technology, vol. 126, No. 3, pp. 479-484 (1979).
Jenkins, "A New Preferential Etch for Defects in Silicon Crystals," J. Electrochem. Soc., 124(5): 757-762 (1977).
Sopori, "A New Defect Etch for Polycrystalline Silicon," J. Electrochem. Soc., 131(3): 667-672 (1984).

* cited by examiner

*Primary Examiner*—Douglas Mc Ginty
(74) *Attorney, Agent, or Firm*—Winston & Strawn LLP

(57) ABSTRACT

The present invention relates to a novel etching solution suitable for characterizing defects on semiconductor surfaces, including silicon germanium surfaces, as well as a method for treating semiconductor surfaces with an etching solution as disclosed herein. This novel etching solution is chromium-free and enables a highly sufficient etch rate and highly satisfactory etch results.

12 Claims, 5 Drawing Sheets

CHROMIUM-FREE ETCHING SOLUTION FOR SI-SUBSTRATES AND USES THEREFOR

BACKGROUND ART

The present relates to a novel chromium-free etching solution suitable for the treatment of silicon substrates as well as silicon germanium substrates, as well as methods for treating such substrates and methods for revealing defects on such substrates using the etching solution in accordance with the present invention.

Crystalline defects in substrates for microelectronic devices are highly undesirable as they have a negative impact on the functionality and reliability of integrated circuits, formed using the substrates, such as wafers, in particular silicon-on-insulator (SOI) type wafers. The typical approach for identifying crystalline defects and thereby characterizing the quality of substrate surfaces is the use of so-called structural etching solutions. These etching solutions, due to the dependency of the etch rate from crystalline structures, can identify crystalline defects, since crystalline defects give rise to either hillocks or etch pits after application of the structural etching solution.

Various etching solutions have been proposed for silicon surfaces which require typically the presence of strong oxidants. F. Secco describes in Journal of Electrochemical Society, 119, no. 7, pp. 948-951 (1972) an etching solution for revealing etch pits in silicon, that includes a mixture of hydrofluoric acid and aqueous alkali dichromate. The alkali chromate acts as oxidizing agent while the hydrofluoric acid dissolves the oxidation product, namely silicon dioxide. However, chromates and, in particular, dichromates are highly toxic due to their ability to interact with cells and DNA.

W. C. Dash in the Journal of Applied Physics, vol. 27, no. 10, pp. 1193-1195 (1956) discloses a further etched solution able to reveal defects on semiconductor substrates, consisting of hydrofluoric acid, nitric acid and acetic acid. While this solution is able to etch semiconductor substrates, including silicon substrates, the etching solution according to Dash is not able to differentiate between different types of defects and furthermore does not provide a satisfactory etch rate.

U.S. Pat. No. 2,619,414 discloses a further chemical etchant to be applied on semiconductor surfaces to improve their electrical characteristics. The chemical etchant disclosed in this patent comprises acetic acid, nitric acid, hydrofluoric acid and bromine. The drawback of this composition is the use of bromine, which is highly instable and volatile, so that the chemical etchant according to this prior art reference can only be stored for a very short time in the dark at low temperatures and can be handled only under ventilation, since bromine evaporates from the composition. Although bromine is not as toxic as chromate or dichromate, precautionary measures nevertheless have to be taken when using the chemical etchant according this patent.

With respect to substrates comprising in addition to silicon also germanium, similar etching solutions have been proposed in the prior art. D. G. Schimmel discloses in J. Electrochem. Soc., Solid State Science and Technology, 479-483 (1979), the use of a chromium comprising solution, mainly characterized by a ratio of $HF/CrO_3$ of 1:1. The major drawback of this etching solution is again the presence of highly toxic chromium. Other chromium containing etching solutions are the solutions according to Wright, comprising HF, $HNO_3$, $CrO_3$, $Cu(NO_3)_2$, water and acetic acid. Again, the major drawback of such an etching solution is the use of highly toxic heavy metals, in particular chromium (M. W. Jenkins, J. Electrochem. Soc., vol. 124 (1977), 757-762).

In view of the above-identified drawbacks of the conventional etching solutions, attempts have been made in order to propose etching solutions being chromium-free. As already indicated above, the etching solution according to Dash comprises hydrofluoric acid, nitric acid and acetic acid, namely HF (concentration 49%), $HNO_3$ (concentration 70%) and acetic acid (concentration 100%) in a volume ratio of 1:3:10. However, as already indicated above, the etch rate obtainable with the etching solution in accordance with Dash is not satisfactory. Other chromium-free etching solutions are, for example, the etching solutions according to Sopori consisting of hydrofluoric acid (concentration of 49%), nitric acid (concentration 70%), acetic acid (concentration 100%) at a volume ratio of 36:1-2:20. Again, the etch rates obtainable with this etching solution are not satisfactory so that this etching solution in fact only has been employed for treating polysilicon (B. L. Sopori, J. Electrochem. Soc. vol. 131 (1984), 667).

Finally, a chromium-free etching solution has been proposed as solution B in the Japanese standard JISHO 609-1999. This solution consists of hydrofluoric acid, nitric acid, acetic acid and water at a volume ratio of 1:12-7:3:5.7. Again, it has to be noted that this etching composition does not provide a suitable etch rate and it furthermore has been determined that this etching solution does not give rise to a homogenous etching so that satisfactory etch result cannot be obtained.

In view of the drawbacks as identified above and the progress semiconductor industry, involving in particular the decrease of the minimum feature sizes used to fabricated integrated circuits, the introduction of new substrate materials, such as silicon on insulator (SOI) or strained silicon on insulator (sSOI), improved etching solutions are required in order to enable suitable quality characterization, in particular with respect to the following features:

satisfactory etch rates, so that even thin substrates can be etched with a sufficient control of etch rate/etch time, removed surface thickness.

etch homogeneity, i.e. homogenous etching without stain generation etc.

etch sensitivity, i.e. the possibility to detect different types of defects (including D defects corresponding to agglomerates of vacancies and oxygen precipitates, as well as bulk stacking fault (BSF) and bulk micro defects (BMD)).

reduction of health risks and environmental problems by using suitable components for the etching solution, without sacrificing the desired properties, such as etch rate, etch sensitivity etc.

stability of the etching solution, so that same can be stored for a certain period of time and can be handled without highly elaborated safety measures.

suitability for different substrates, including silicon substrates as well as silicon germanium substrates.

This need is now addressed by the present invention.

SUMMARY OF THE INVENTION

Accordingly, the present invention provides a chromium-free etching solution which enables suitable etching, in particular fulfilling one or more of the desiderata identified above. In particular, this etching solution comprises HF, $HNO_3$, and acetic acid, wherein the HF is present as an aqueous solution having a concentration of 49%, the $HNO_3$ is present in as an aqueous solution having a concentration of 70%, and the acetic acid is present at a concentration of 100%), with these acids present at a volume ratio of 1:10-20:

8-17, respectively. Compared to the solutions that are known in the art, this etching solution is chromium-free and enables a highly sufficient etch rate and highly satisfactory etch results.

The etching solution may be used in a method for characterizing defects on silicon substrates or for use as a general etchant in a process for etching silicon substrates. Further preferred embodiments for all aspects in accordance with the present invention are also explained in the following description.

DETAILED DESCRIPTION OF THE PREFERRED EMBODIMENTS

Figure 1:
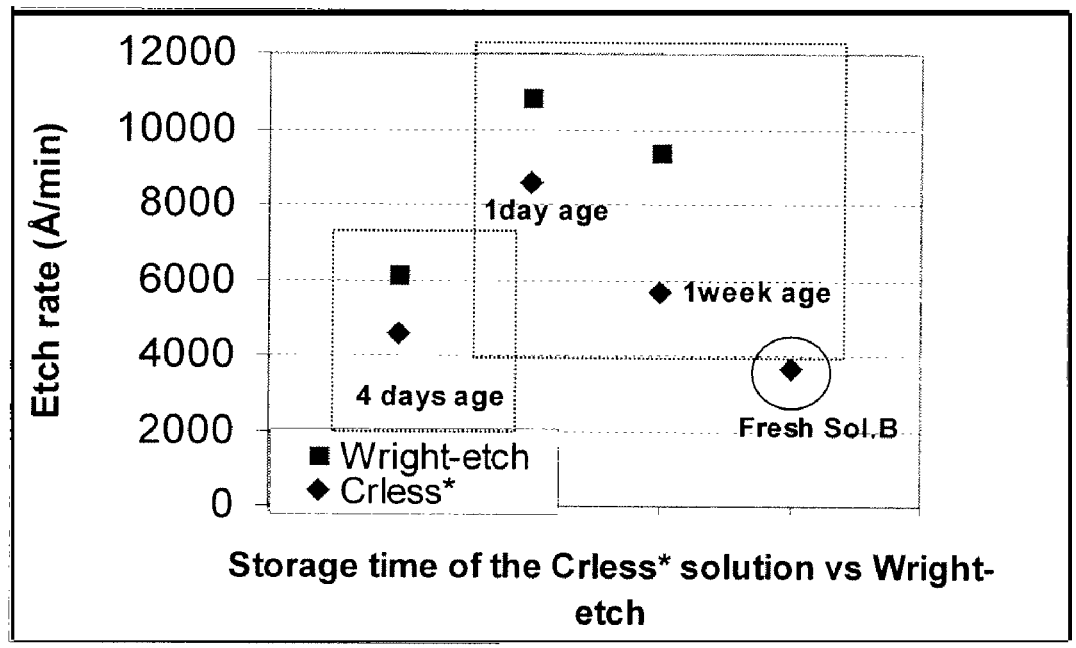
FIG. 1 shows a comparison of etch rates obtained with the etching solution according to Wright (prior art) in comparison with etching solutions in accordance with the present invention (CRLESS).

The present invention will be first described in connection with the etching solution. The preferred embodiments discussed here below, however, also apply with respect to the methods and processes of the present invention, unless otherwise stated.

The present invention is mainly characterized in that a novel etching solution for treating semiconductor surfaces is provided. The term "semiconductor surfaces" as employed in accordance with the present invention aims at defining any type of semiconductor surfaces, including substrates such as SOI and sSOI, as well as substrates such as silicon germanium substrates. The etching solution in accordance with the present invention is chromium-free and comprises hydrofluoric acid, nitric acid and acetic acid. Preferably, the etching solution in accordance with the present invention consists of hydrofluoric acid, nitric acid and acetic acid and preferably the components identified above are present in the form as further detailed below.

The hydrofluoric acid to be employed in accordance with the present invention is an aqueous solution of HF with a concentration preferably as high as possible, typically about 49% (vol %). The below given compositional ratios of the etching solution in accordance with the present invention refer to aqueous HF having a concentration of 49%.

Furthermore, the etching solution in accordance with the present invention comprises nitric acid. The nitric acid to be employed in accordance with the present invention again preferably is an aqueous solution having a concentration as high as possible, typically about 70% (vol %). The following preferred compositional ratios of the etching solution in accordance with the present invention refer to an aqueous nitric acid having a concentration of 70%.

The acetic acid to be employed in accordance with the present invention again preferably is as concentrated as possible, preferably pure acetic acid, such as an acetic acid commercially available as glacial acetic acid having an acetic acid content of at least 99%. Preferably, the acetic acid to be employed in accordance with the present invention is pure, i.e. 100% acetic acid. The following preferred compositional ratios of the etching solution in accordance with the present invention refer to pure acetic acid having a concentration of 100% (vol %).

As indicated above, it is highly preferred that the etching solution in accordance with the present invention consist of only the three components identified above, i.e. the etching solution is an aqueous mixture (solution) of hydrofluoric acid with a concentration of at least 49%, nitric acid with a concentration of at least 70% and acetic acid with a concentration of as close to 100% as possible (with respect to the individual components). If desired, however, other additives that do not affect the etching performance of the solution can be included although these are not necessary.

The etching solution in accordance with the present invention typically comprises the three essential components identified above in a ratio (volume ratio) of HF (concentration about 49%) $HNO_3$ (concentration about 70%):acetic acid (concentration about 100%) of 1:12-20:8-20, preferably 1:13-16:9-14 and more preferably 1:15:10-13. The acetic acid content typically is lower that that ordinarily used for treating silicon substrates whereas the acetic acid content on the other hand typically is higher that that used for treating silicon germanium substrates.

Representative etching solutions in accordance with the present invention comprise the three components mentioned above in the following volume ratios:

1:15:10

1:15:10.5

1:15:11

1:15:12

1:15:13

The latter two solution compositions are in particular more suitable for silicon germanium substrates whereas the first two etching solutions are in particular more suitable for silicon substrates, more particularly the second etching solution which enables to obtain a more homogenous surface, avoiding stain generation thereon.

Preferred embodiments and effects in accordance with the present invention are further explained by reference to the appended drawing figures. FIG. 1 shows that etch rates with etching solutions in accordance with the present invention (CRLESS) are suitable and comparable to etch rates obtainable with an etching solution according to Wright-etch. Furthermore, FIG. 1 clearly shows that the etching solution in accordance with the present invention may be stored for several days and even one week or more without losing the ability to etch substrate at a suitable etch rate. The experiments as represented by FIG. 1 have been carried out with an etching solution in accordance with the present invention having a compositional ratio of 1:15:10.5 and etching has been carried out on silicon substrates. In FIG. 1, a comparison is furthermore shown with respect to a solution B according to a Japanese standard (JISHO609-1999), showing that the etch rate of a fresh solution B is even lower than the etch rate of the etching solution in accordance with the present invention, even after several days of aging. Accordingly, the present invention provides a higher etch rate and solution B as known from the prior art accordingly does not provide a sufficiently high etch rate.

Figure 2:
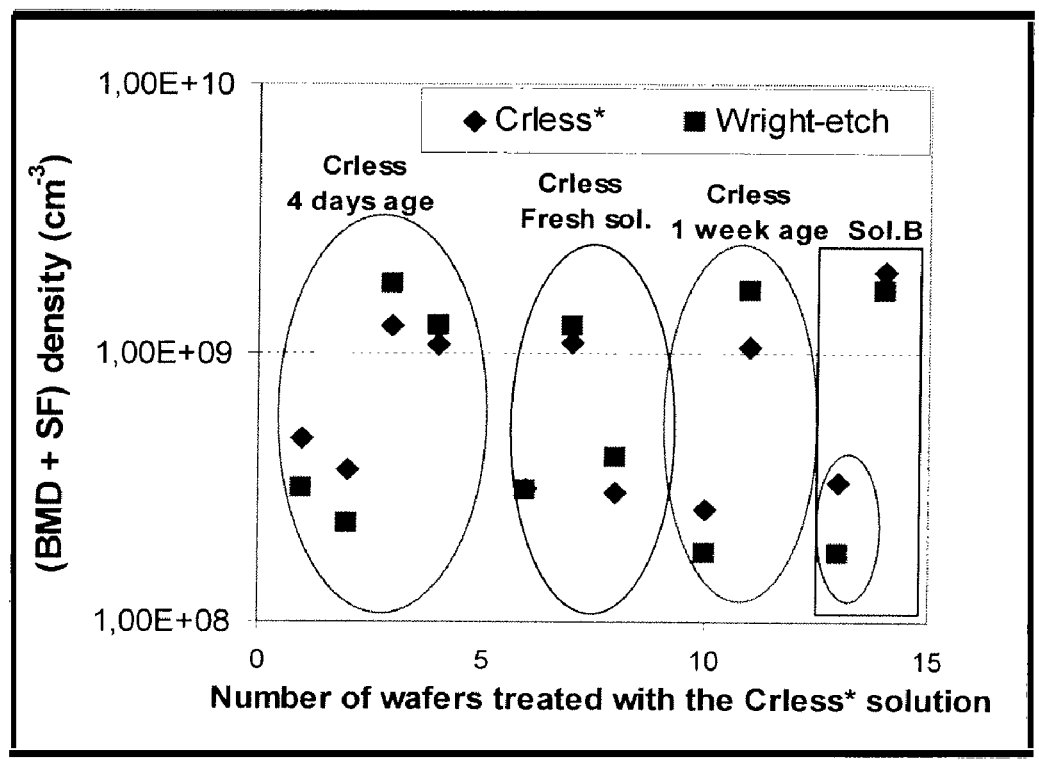
FIG. 2 shows a further comparison between etching results obtained using the etching solution according to Wright in comparison with an etching solution in accordance with the present invention.

FIG. 2 displays a further comparison of etching solutions in accordance with the present invention with etching solutions according to the prior art disclosure Wright-etch. FIG. 2 displays a correlation between the total defect density as detected (sum of BMD and BSF, abbreviated SF in the figures) and shows that even with etching solutions in accordance with the present invention which have been stored for several days, etching results similar to the prior art composition according to Wright can be obtained. FIG. 2 also displays results with the solution B as indicated above. These results again display that etching with the solution B does not provide satisfactory correlation results, especially with lower defect (BMD+SF) densities (<1E+09 $cm^{-3}$). A similar correlation is also given in FIG. 3 which compares the results as obtained in accordance with the present invention and the results obtained by Wright-etch focusing on the BSF defects only.

Figure 3:
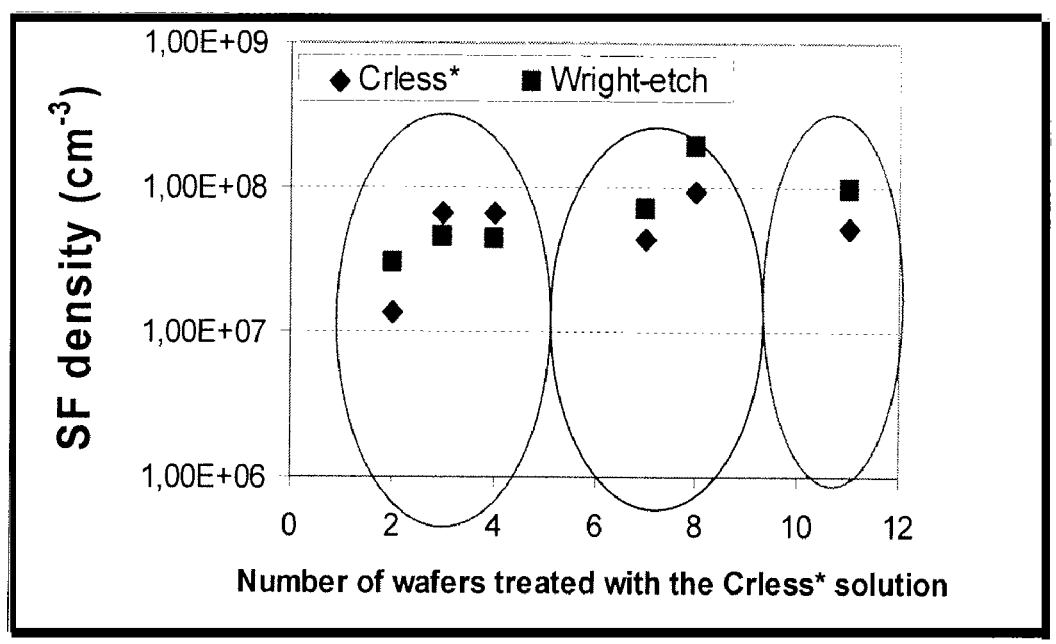
FIG. 3 shows a further comparison of etching solutions in accordance with the present invention and etching solutions in accordance with the prior art.

The compositions in accordance with the present invention as employed for the experiments depicted in FIGS. 2 and 3 are etching composition as described above in connection with FIG. 1.

Figure 4:
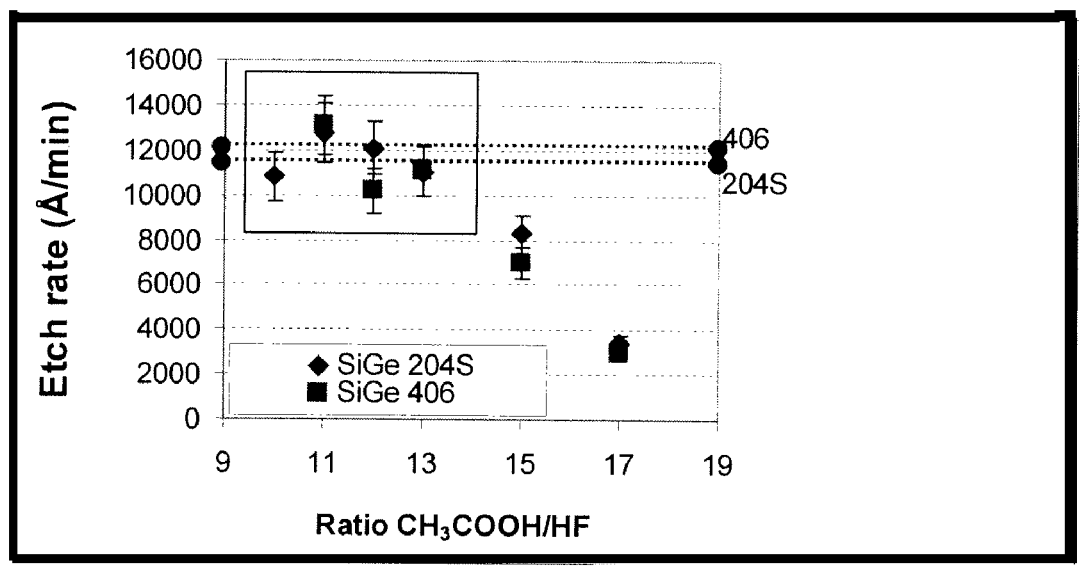
FIG. 4 shows a graph displaying etched rates for etching solutions in accordance with the present invention on silicon germanium substrates at various volume ratios of acetic acid: hydrofluoric acid.

FIG. 4 shows a correlation of the etch rate depending on the ratio of acetic acid:HF (nitric acid content always 15 vol. % in these tests) on various silicon germanium substrates. These results clearly show that with varying ratios highly suitable etch rates can be obtained and in particular with compositions of a volume ratio of 10:1 to 13:1 (concerning the ratio of acetic acid:HF), highly suitable high etch rates can be obtained.

Figure 5:
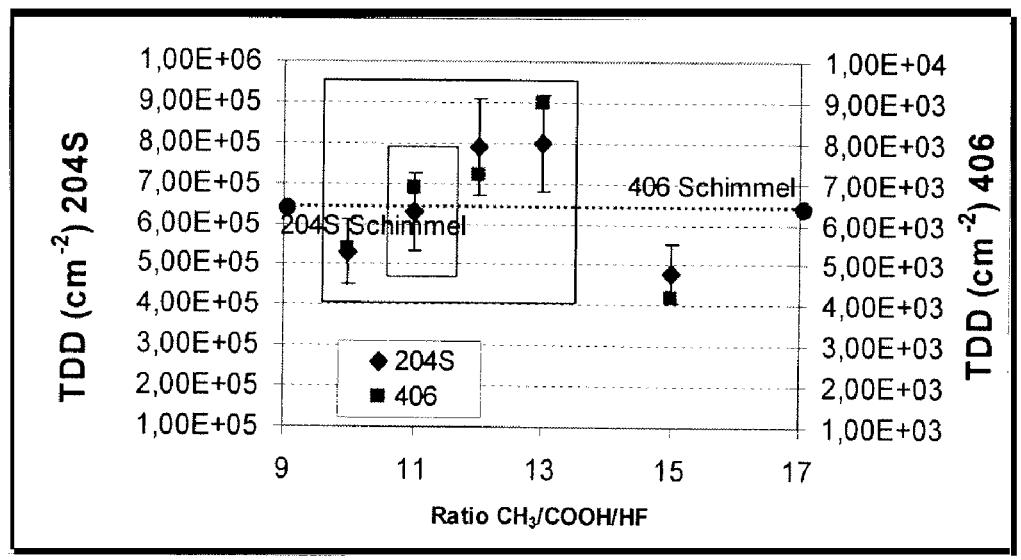
FIGS. 5 and 6 show correlations between etch results and the ratio of acetic acid: hydrofluoric acid for etching solutions in accordance with the present invention in comparison to results obtained with a prior art etching solution according to Schimmel.
Figure 6:
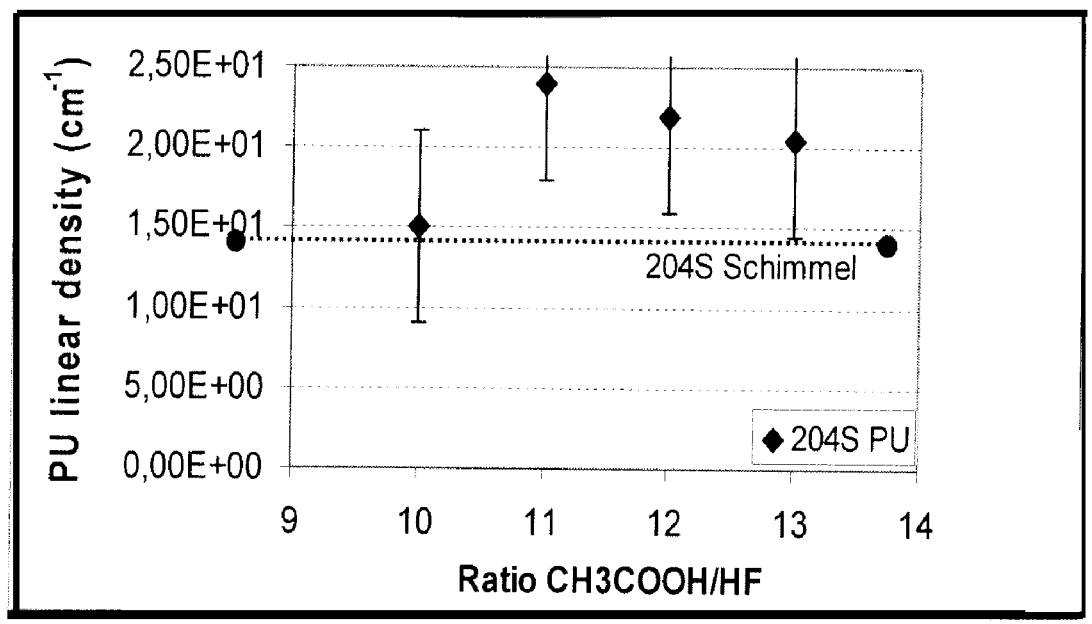

FIG. 5 displays a similar correlation and also displays, in addition, results as obtained with the prior art etching solution according to Schimmel. FIG. 5 does not display the etch rates but the total defect density as obtained and again proves a good correlation of the results in accordance with the present invention, compared with the prior art technique. A similar correlation is also depicted in FIG. 6 and the results as shown in the above-discussed figures clearly display a preferred compositional ratio for acetic acid from 11 to 13.

Figure 7:
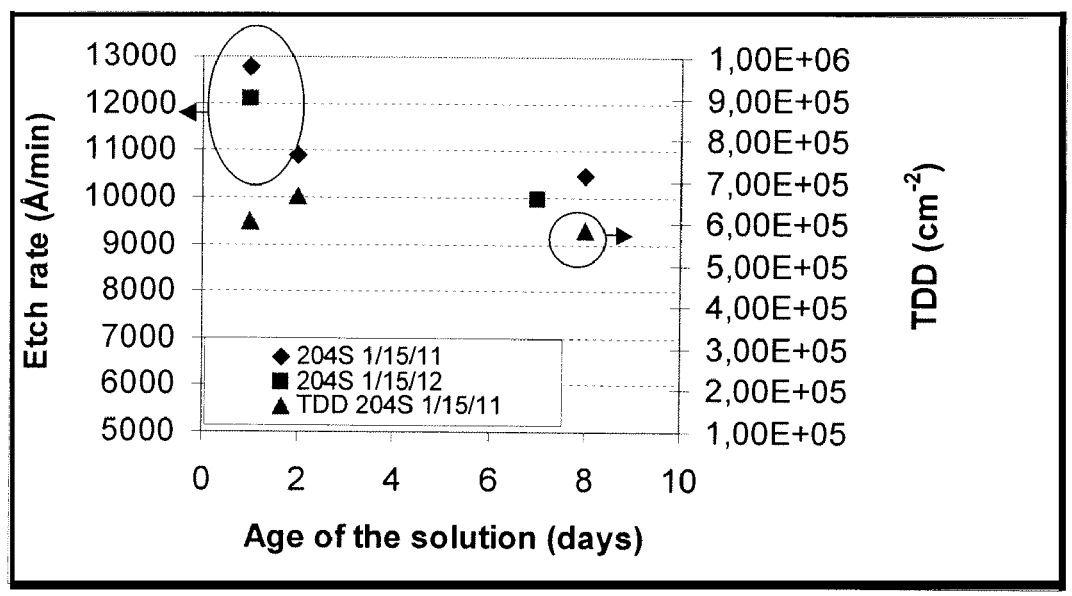
FIG. 7 shows results of etching experiments using etching solutions in accordance with the present invention which have been aged for several days.

FIG. 7 finally shows etch rates for etching solutions in accordance with the present invention depending on the time of storage and, in this respect, the results as depicted in FIG. 7 clearly reveal that the present invention enables the storage of the etching solution without substantial loss of etch rate or total defect density (TDD) revealed. The experiments as depicted in FIG. 7 have been carried out with etching solutions having a compositional ratio of 1:15:11 and 1:15:12, respectively.

As identified above, the present invention provides a novel and superior etching solution which is chromium-free and also does not need include bromine. This facilitates the handling and increases working environment safety and reduces health risks. Furthermore, the etching solution in accordance with the present invention enables a suitable etch rate for various substrates, at rates of from 5000 to 8000 Å/min for silicon substrates and from 8000 to 13000 Å/min for silicon germanium substrates. The etching solution in accordance with the present invention also reveals the defects with the desired reliability, as evidenced by the comparisons presented above with respect to the prior art solutions. Furthermore, homogenous etching is obtained without stain generation.

Accordingly, it has been shown that the etching solution in accordance with the present invention may be employed as a replacement of conventional etching solutions in the industrial process of etching of semiconductor substrates.

As indicated above, the present invention also provides a method for characterizing defects on semiconductor substrates as well as a process for etching semiconductors substrates, which both comprise a step of etching a semiconductor surface with an etching solution as defined herein. In the method as well as the process in accordance with the present invention, the silicon surfaces may be surfaces of various semiconductor substrates, such as conventional silicon substrates, SOI or sSOI materials as well as silicon germanium substrates.

The substrates may be subjected to any conventional pre-treatment, such as dipping into HF, and after application of etching solution in accordance with the present invention, the substrates again may be subjected to conventional post-treatments, such as washing, drying etc. as required. The treated semiconductor surface can be visually observed to determine whether the etching has provided the desired results or whether the treatment needs to be repeated.

As indicated above, the use of the etching solution in accordance with the present invention enables a superior control of the etch rate together with a highly satisfactory etch results, such as highly reliable detection of defects on the treated surface as well as homogenous etching without stain generation.

What is claimed is:

1. A method for characterizing defects on semiconductor surfaces, which comprises treating such semiconductor surfaces with an etching solution comprising a mixture of HF, $HNO_3$, and acetic acid, wherein the HF is present in the mixture as an aqueous solution having a concentration of about 49% (vol. %), the $HNO_3$ is present in the mixture as an aqueous solution having a concentration of about 70% (vol. %), and the acetic acid is present in the mixture at a concentration of at least about 99% (vol. %), with these acids present in the mixture at a volume ratio of 1:13-16:9-14 respectively.

2. The method of claim 1, wherein the semiconductor surface is bulk silicon, a SOI substrate, an sSOI substrate or a silicon germanium substrate.

3. The method of claim 1, which further comprises pre-treating the semiconductor surface with HF prior to treatment with the etching solution.

4. The method of claim 1, which further comprises post-treating the semiconductor substrates by rinsing with de-ionized water.

5. The method of claim 1, which further comprises visually evaluating the treated semiconductor surface to determine if the treatment needs to be repeated.

6. A process for etching semiconductor surfaces, comprising the step of treating the semiconductor surface with an etching solution comprising a mixture of HF, $HNO_3$, and acetic acid, wherein the HF is present in the mixture as an aqueous solution having a concentration of about 49% (vol. %), the $HNO_3$ is present in the mixture as an aqueous solution having a concentration of about 70% (vol. %), and the acetic acid is present in the mixture at a concentration of at least about 99% (vol. %), with these acids present in the mixture at a volume ratio of 1:13-16:9-14 respectively.

7. The process of claim 6, wherein the semiconductor surface is a SOI substrate, an sSOI substrate or a silicon germanium substrate.

8. The process of claim 6, which further comprises pretreating the semiconductor surface with HF prior to treatment with the etching solution.

9. The process of claim 6, which further comprises post-treating the semiconductor surface by rinsing with de-ionized water.

10. The process of claim 6, which further comprises visually evaluating the treated semiconductor surface to determine if the treatment needs to be repeated.

11. The method of claim 1, wherein the acids are present in the mixture at a volume ratio of 1:15:10-13.

12. The method of claim 6, wherein the acids are present in the mixture at a volume ratio of 1:15:10-13.

* * * * *